United States Patent
Tanaka et al.

(10) Patent No.: US 9,007,502 B2
(45) Date of Patent: Apr. 14, 2015

(54) SOLID-STATE IMAGING DEVICE INCLUDING A PHOTODIODE CONFIGURED TO PHOTOELECTRICALLY CONVERT INCIDENT LIGHT

(75) Inventors: Nagataka Tanaka, Yokohama (JP); Shinji Uya, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 454 days.

(21) Appl. No.: 12/621,798

(22) Filed: Nov. 19, 2009

(65) Prior Publication Data

US 2010/0128156 A1 May 27, 2010

(30) Foreign Application Priority Data

Nov. 21, 2008 (JP) ................ 2008-298539

(51) Int. Cl.
*H04N 3/14* (2006.01)
*H04N 5/335* (2011.01)
*H04N 5/3745* (2011.01)
*H04N 5/378* (2011.01)
*H01L 27/146* (2006.01)

(52) U.S. Cl.
CPC ........ *H04N 5/3745* (2013.01); *H01L 27/14609* (2013.01); *H04N 5/37452* (2013.01); *H04N 5/378* (2013.01)

(58) Field of Classification Search
USPC ................ 348/302–304, 307–310; 250/208.1
See application file for complete search history.

(56) References Cited

U.S. PATENT DOCUMENTS

2002/0000508 A1  1/2002 Muramatsu et al.
2005/0083421 A1* 4/2005 Berezin et al. ................ 348/308
2007/0120982 A1* 5/2007 Oita et al. ................ 348/207.99
2008/0210993 A1  9/2008 Oshikubo et al.
2009/0045319 A1  2/2009 Sugawa et al.

FOREIGN PATENT DOCUMENTS

| EP | 1868377 A1 * | 12/2007 |
|---|---|---|
| JP | 2000-165754 | 6/2000 |
| JP | 2002-77737 | 3/2002 |
| JP | 2006-245522 | 9/2006 |
| JP | 2007-6478 | 1/2007 |
| JP | 2007-27601 | 2/2007 |
| JP | 2007-335681 | 12/2007 |
| JP | 2008-172608 | 7/2008 |
| JP | 2008-205638 | 9/2008 |

OTHER PUBLICATIONS

Office Action issued Dec. 24, 2012 in Taiwanese Patent Application No. 098139192.
Office Action issued Jul. 3, 2012 in Japanese Application No. 2008-298539 (With English Translation).

* cited by examiner

*Primary Examiner* — Twyler Haskins
*Assistant Examiner* — Carramah J Quiett
(74) *Attorney, Agent, or Firm* — Oblon, McClelland, Maier & Neustadt, L.L.P.

(57) ABSTRACT

A solid-state imaging device includes a plurality of unit pixels. Each unit pixel has a photodiode, a reading transistor, a floating diffusion, a capacitance adding transistor, and a reset transistor. The reading transistor reads signal electric charges from the photodiode. The floating diffusion accumulates the signal electric charges read from the reading transistor. The capacitance adding transistor selectively adds capacitance to the floating diffusion. The reset transistor resets an electric potential of the floating diffusion.

15 Claims, 5 Drawing Sheets

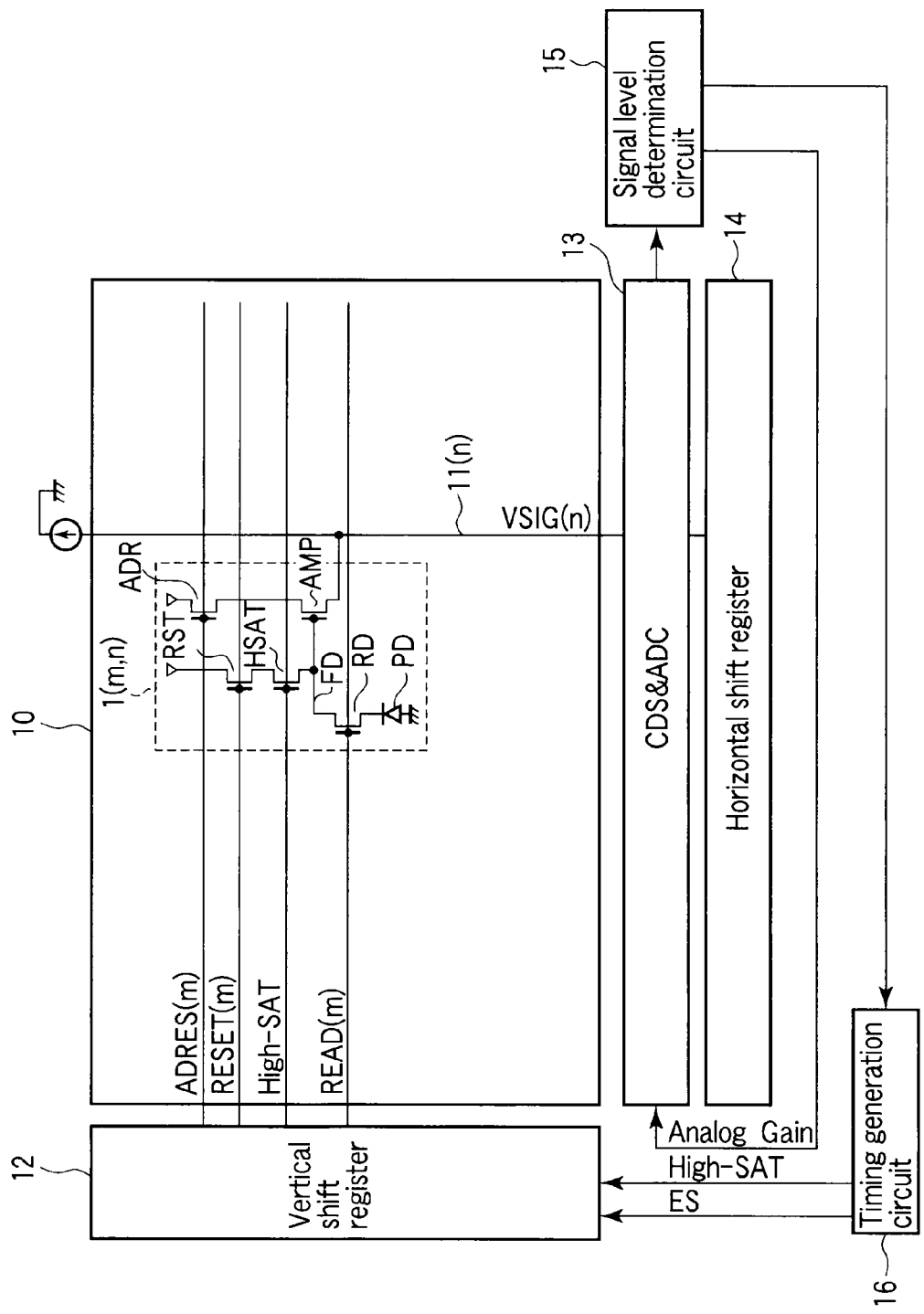
F I G. 3

SOLID-STATE IMAGING DEVICE INCLUDING A PHOTODIODE CONFIGURED TO PHOTOELECTRICALLY CONVERT INCIDENT LIGHT

CROSS-REFERENCE TO RELATED APPLICATIONS

This application is based upon and claims the benefit of priority from prior Japanese Patent Application No. 2008-298539, filed Nov. 21, 2008, the entire contents of which are incorporated herein by reference.

BACKGROUND OF THE INVENTION

1. Field of the Invention

The present invention relates to a solid-state imaging device, and more specifically relates to a circuit configuration of a unit pixel. The imaging device of the present invention is used, for example, to a CMOS image sensor.

2. Description of the Related Art

A plurality of unit pixels is arranged in an imaging area of the CMOS image sensor. Each unit pixel includes a photodiode, a floating diffusion, a reading transistor, an amplification transistor, a reset transistor, and a selection transistor. The photodiode photoelectrically converts incident light. The reading transistor performs reading of accumulated electric charges from the floating diffusion. The amplification transistor amplifies the signal of the floating diffusion to output the amplified signal to a vertical signal line. The reset transistor resets a gate electric potential (an electric potential of a floating diffusion). The selection transistor selects the unit pixels to control an operation of the amplification transistor.

In general, it is well known for the CMOS sensor that a thermal noise and 1/f noise are conspicuous. These noises are called a dark state random noise. To improve the dark state random noise, it is effective to raise a signal level of the floating diffusion in a preliminary step of an occurrence of the random noise. The voltage amplitude out(v) of the floating diffusion is given by an equation of out(v)=(e/CFD)×input (q). Here, "e" is an electric charge amount, CFD is capacitance of the floating diffusion, and input(q) is the number of signal electric charges. To enlarge the voltage amplitude of the floating diffusion and reduce the dark state random noises, it is effective to reduce the CFD of the capacitance of the floating diffusion. A conversion gain Gain of the unit pixel is given by an expression of Gain=Out(v)/input(q).

FIG. 1 shows a figure illustrating a reset operation and a reading operation in a case in which a signal electric charge amount accumulated in the photodiode PD is relatively small in a generic COMS sensor. That is, by turning on the reset transistor RST to perform a reset operation, the electric potential of the floating diffusion FD immediately after the reset operation is set to the same electric potential level as that of a drain. Next, when turning on the reading transistor RD, since a signal electric charge amount accumulated in the photodiode PD is relatively small, it is possible to transfer the signal electric charges to the floating diffusion FD even if the capacitance CFD of the floating diffusion FD is designed in a small size.

FIG. 2 shows a view illustrating a reset operation and a reading operation in a case in which the signal electric charge amount accumulated in the photodiode FD is relatively large in a generic CMOS sensor. That is, turning on the rest transistor RST to perform the reset operation allows the electric potential of the floating diffusion immediately after the reset operation to be set to the same electric potential level as that of the drain. When turning on the reading transistor RD at the next time, since the signal electric charges accumulated in the photodiode PD becomes an over amount, it is impossible to transfer all of the signal electric charges to the floating diffusion FD. A remnant Lag of the signal electric charges generates in the photodiode PD.

A technique adding gate capacitance to the floating diffusion in the unit pixel, which makes the capacitance of the floating diffusion variable, is disclosed in Jpn. Pat. Appln. KOKAI Publication No. 2000-165754. However, in this technique, even when tuning off the gate capacitance added for high sensitivity, parasite capacitance between the gate and the floating diffusion cannot be perfectly made zero. Thereby, in comparison with a case where the floating diffusion capacitance is not made variable, the floating diffusion capacitance increases, and the conversion gain decreases. As a result, a dark state random noise characteristic is deteriorated.

Meanwhile, a technique which increases the signal electric charge treatment amount by adding capacitance to a photodiode through a MOS transistor in a unit pixel is disclosed in Jpn. Pat. Appln. KOKAI Publication No. 2002-77737. However, in this technique, the reading transistor is not existed, and the photodiode and the newly added capacitance are connected to a gate of an amplification transistor. Thereby, a conversion gain is lowered. As a result, dark state random noise characteristics are deteriorated.

A technique increases a signal electric charge amount by adding capacitance to the photodiode through a MOS transistor is disclosed in Jpn. Pat. Appln. KOKAI Publication No. 2006-245522. However, in this technique, in comparison with the conventional unit pixel, since it is needed to add circuit elements of total four of two transistors and two capacitors, shrink of the pixel size is made difficult.

As described above, in the conventional solid-state imaging device, the dark state random noise and the signal electric charge treatment amount are in a tradeoff (inconsistent) relationship, it is difficult to increase the signal electric charge treatment amount while maintaining the low noise in the dark, the improvement in this problem is desired.

BRIEF SUMMARY OF THE INVENTION

According to a first aspect of the present invention, there is provided a solid-state imaging device comprising:

a photodiode configured to photoelectrically convert incident light;

a first transistor configured to connect the photodiode and to read signal electric charges from the photodiode;

a floating diffusion configured to connect the first transistor and to accumulate the signal electric charges read from the first transistor;

a second transistor configured to connect the floating diffusion and to selectively add capacitance to the floating diffusion; and a third transistor configured to connect the second transistor and to reset an electric potential of the floating diffusion.

According to a second aspect of the present invention, there is provided a solid-state imaging device comprising:

a plurality of photodiodes each configured to photoelectrically convert incident light;

a plurality of first transistors configured to connect the plurality of photodiodes and to respectively read signal electric charges from the plurality of photodiodes;

a floating diffusion configured to commonly connect the plurality of first transistors and to accumulate the signal electric charges read from the plurality of first transistors;

a second transistor configured to connect the floating diffusion and to selectively add capacitance to the floating diffusion; and a third transistor configured to connect the second transistor and to reset an electric potential of the floating diffusion.

According to a third aspect of the present invention, there is provided a solid-state imaging device comprising:

a pixel area configured to include a plurality of pixels and to output a signal of each pixel, each pixel includes a photodiode configured to photoelectrically convert incident light; a first transistor configured to connect to the photodiode and to read signal electric charges from the photodiode; a floating diffusion configured to connect the first transistor and to accumulate the signal electric charges read from the first transistor; a second transistor configured to connect the floating diffusion and to selectively add capacitance to the floating diffusion; and a third transistor configured to connect the second transistor and to reset an electric potential of the floating diffusion;

an analog to digital conversion circuit configured to convert a pixel signal output from the pixel area into a digital signal;

a signal level determination circuit configured to receive the digital signal converted by the analog to digital conversion circuit and to determine a level of the pixel signal output from the pixel area; and a control signal generation circuit configured to receive a determination output from the signal level determination circuit and to output a control signal for controlling the second transistor on the basis of the determination output.

BRIEF DESCRIPTION OF THE SEVERAL VIEWS OF THE DRAWING

FIG. 3 is an exemplary block diagram schematically depicting a CMOS image sensor according to a first embodiment of the present invention;

DETAILED DESCRIPTION OF THE INVENTION

Figure 1:
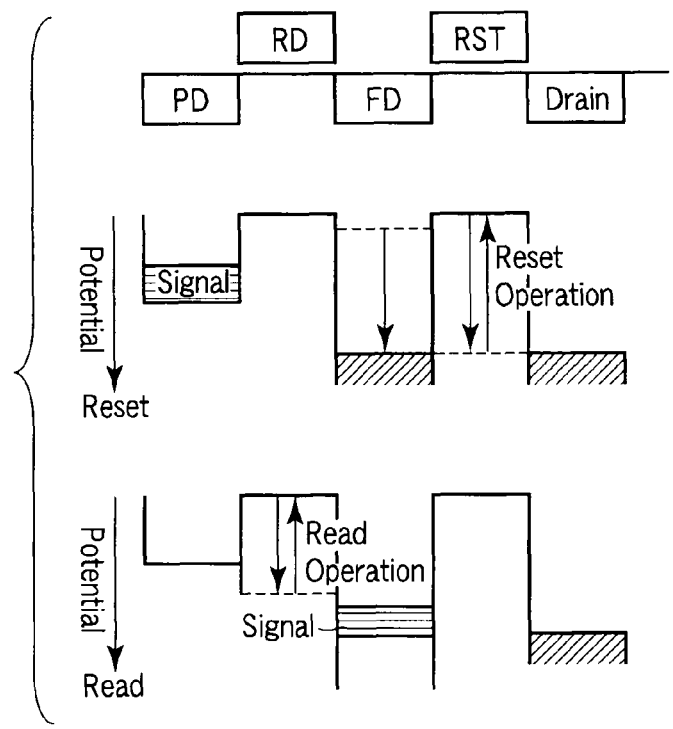
FIG. 1 is an exemplary view depicting a reset operation and a reading operation in a case where a signal electric charge amount accumulated in a photodiode in a unit pixel is relatively small in a generic CMOS diode.
Figure 2:
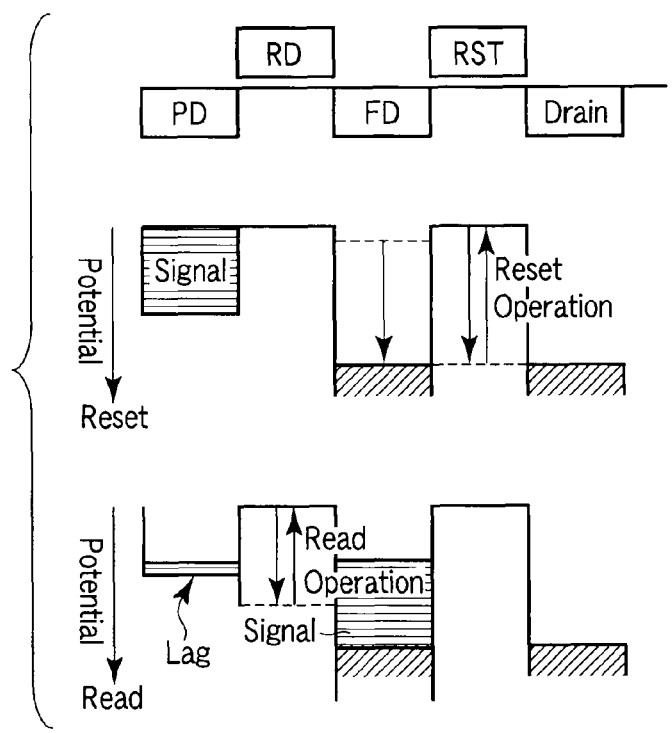
FIG. 2 is an exemplary view depicting a reset operation and a reading operation in a case where the signal electric charge amount accumulated in the photo diode is relatively large in the unit pixel in the generic CMOS sensor.

Hereinafter, various embodiments of the present invention will be described with reference to the drawings. In the descriptions of these kinds of embodiments, common components in all views are designated by identical reference symbols.

First Embodiment

FIG. 3 shows a block diagram schematically illustrating a CMOS sensor according to a first embodiment of a solid-state imaging device of the present invention. A numeral symbol 10 designates a pixel area including a plurality of unit pixels 1 arranged on m-row and n-column. Here, one unit pixel 1(m, n) among the plurality of unit pixels, and one vertical signal line 11(n) among vertical signal lines formed in a row direction corresponding to each column of pixel area are expressed representatively.

A numeral symbol 12 designates a vertical shift resister supplying a plurality of control signals ADRESS(m), RESET (m), READ(m), High-SAT to each row of the pixel area, a numeral symbol 13 designates a correlated double sampling (CDS) & analog to digital conversion circuit (ADC) connected to the vertical signal line 11(n) of each column of the pixel area, a numeral symbol 14 designates a horizontal shift register connected to the CDS & ADC 13, and a numeral symbol 15 designates a signal level determination circuit, and a numeral symbol 16 designates a timing generator circuit.

The signal level determination circuit 15 determines whether or not an output signal VSIG(n) of a unit pixel is not larger than a predetermined value on the basis of a level of a signal output from the CDS & ADC 13, and supplies the determination output to a timing generation circuit 16, and also supplies to the CDS & ADC 13 as an analog gain control signal.

The timing generation circuit 16 generates an electronic shutter control signal ES for controlling an accumulation time of the photodiode, and a control signal High-SAT for controlling on and off operations of a transistor for capacitance addition of capacitance mentioned below in the unit pixel at each predetermined timing to supply those control signals ES, High-SAT to the vertical shift register 12. The control signal High-SAT is generated on the basis of the determination output by the signal level determination circuit 15.

The COMS image sensor of FIG. 3 can perform automatic exposure control by appropriately setting three items of control of accumulation time control by an electronic shutter control signal ES, analog gain control by the CAD & ADC 13 on the basis of the determination output from the signal level determination circuit 15, and on/off control of the transistor (HAST) for adding capacitance.

The unit pixel 1(m, n) in FIG. 3 includes a photodiode FD configure to photoelectrically convert and to accumulate incident light, a reading transistor RD configured to read the accumulated electric charges in photodiode FD for a floating diffusion FD and to control the electric charges, an amplification transistor AMP configured to amplify the signal of the floating diffusion FD and to output the signal to the vertical signal line, a reset transistor RST configured to reset the electric potential (gate unit of a amplification transistor AMP), and a selection transistor ADR configured to select and control to supply a power source voltage to the amplification transistor AMP and the unit pixel in a desired horizontal position in a vertical direction. The gate electrode of the amplification transistor AMP is connected to the floating diffusion FD. To reduce the dart random noise, it is preferable to design so as to make floating diffusion capacitance CFD small.

Further, in the first embodiment, a transistor HSAT for adding capacitance in the unit pixel 1(m, n), the source of the transistor HSAT is connected to the floating diffusion FD, and the drain is connected to the drain of the reset transistor RST. That is, the transistor HSAT is connected between the reset transistor RST and the floating diffusion FD. All of each foregoing transistors are n-type MOSFETs in this example.

The unit pixel $1(m, n)$ in the embodiment, differs in a point that one transistor HSAT for adding the capacitance is added, and the number of added circuit elements per one photodiode is only one in comparison with a generic unit pixel.

Next, an outline of an operation of the COMS image sensor of FIG. 3 will be described. To drive the unit pixel $1(m, n)$ in the pixel area 10, the vertical shift register 12 outputs each control signal ADRES(m), RESET(m), High-SAT, and READ(m). The output signal VSIG(n) of the unit pixel is input to the CDS & ADC 13 via the vertical signal line $11(n)$ connected in correspondence to be performed analog to digital conversion. The signal level determination circuit 15 determines whether or not the output signal VSIG(n) is smaller than a predetermined value on the basis of the level of the signal output from the CDS & ADC, and supplies the determination output to the CDS & ADC 13 and to the timing generation circuit 16. The timing generation circuit 16 generates the electronic shutter control signal ES for controlling the accumulation time of the photodiode PD, and the control signal High-SAT controlling the on/off operation of the transistor HSAT for adding the capacitance at each prescribed timing to supply these control signals to the vertical shift register 12.

Appropriately setting three items of control of accumulation time control by means of the electronic shutter control signal ES, analog gain control of the CDS & ADC 13 on the basis of the determination output by the signal level determination circuit 15, and on/off control of the transistor HSAT for adding the capacitance enables performing automatic exposure light control.

The on/off control of the transistor HSAT for adding the capacitance by the control signal High-SAT is executed as follows. When the unit pixel $1(m, n)$ is designed once, it can be known in advance which of the extents of the signal electronic charge amount of the photodiode PD saturates the floating diffusion FD. The signal level determination circuit 15 turns on the transistor HSAT if the floating diffusion FD is equal to or larger than a saturation level of the floating diffusion on the basis of the level of the output signal of the CDS & ADC 13 depending on the output signal VSIG(n) of the unit pixel, and turns off the transistor HSAT to reduce the dark state random noise if the floating diffusion FD is smaller than the saturation level. That is, the transistor HSAT conducts on the basis of the control signal High-SAT, and selectively adds the capacitance to the floating diffusion FD. That is, the transistor HSAT is conducted when the control signal High-SAT is in a high level (first state), thereby, the capacitance is added to the floating diffusion FD, and when the control signal is in a low level (second state), the transistor HSAT is not conducted. The capacitance to be added to the floating diffusion FD is channel capacitance of the transistor HSAT, capacitance between a gate and a source, hereinafter; these kinds of capacitance are generically called a gate capacitance CHSAT of the transistor HSAT.

According to the CMOS image sensor of the embodiment, as a result of the on/off control of the transistor HSAT given above, getting over a relationship of tradeoff between the dark state random noise and the signal electric charge treatment amount enables increasing the signal electric charge treatment amount while maintaining the low noise in the dark state.

Figure 4:
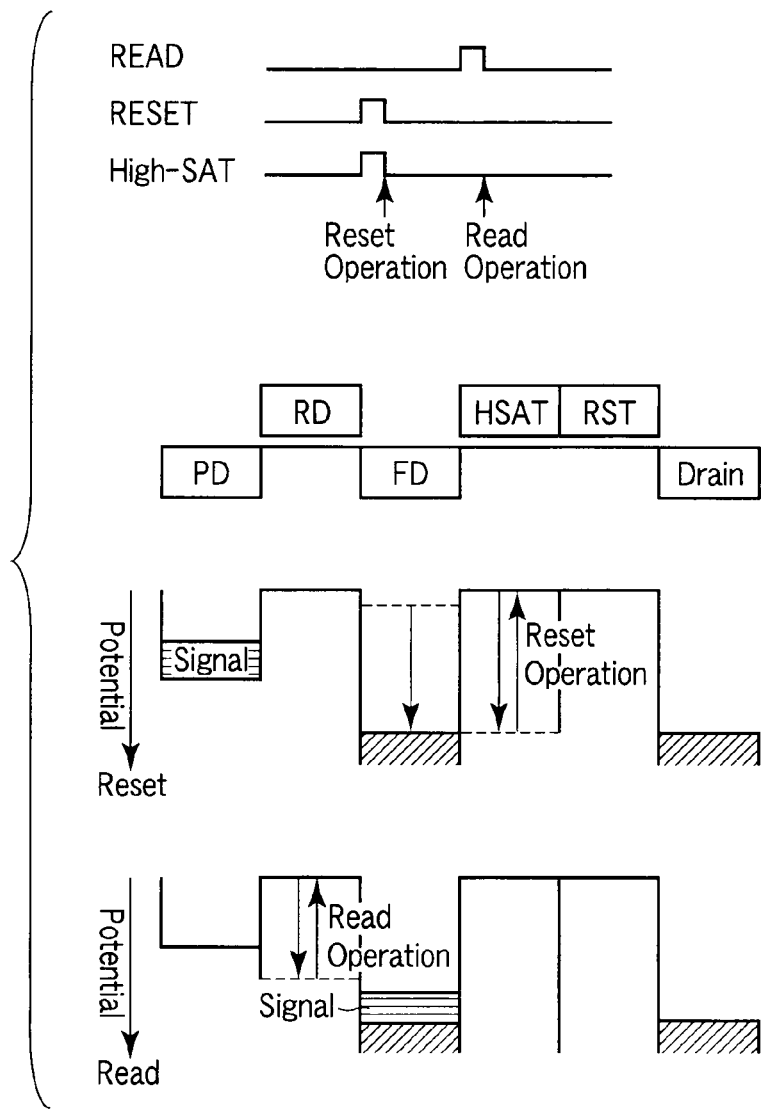
FIG. 4 is an exemplary view depicting an example of operation timing in a case where the signal electric charge amount accumulated in the photodiode is relatively small in the unit pixel in FIG. 3, an electric potential on a semiconductor substrate in a reset operation, and electric potential in reading operation.

Detailed operations of the unit pixel $1(m, n)$ in FIG. 3 will be described. FIG. 4 shows an example of operation timing, an electric potential in the semiconductor substrate in a reset operation and an electric potential in a reading operation, and a reset operation in a case where the signal electric charge amount accumulated in the photodiode PD in the unit pixel $1(m, n)$ is relatively small. That is, by simultaneously turning on the reset transistor RST and the transistor HSAT, the reset operation is performed. The electric potential of the floating diffusion FD immediately after the reset operation is set to the same electric potential as that of the drain. After the reset operation, both the reset transistor RST and the transistor HSAT are turned off.

When turning on the reading transistor RD at the next time, since the signal electric charge amount accumulated in the photodiode PD until the time is small, although the capacitance of the floating fusion FD for reducing the dark state random noise is made small as mentioned above, it is possible to transfer the signal electric charges to the floating diffusion FD.

Figure 5:
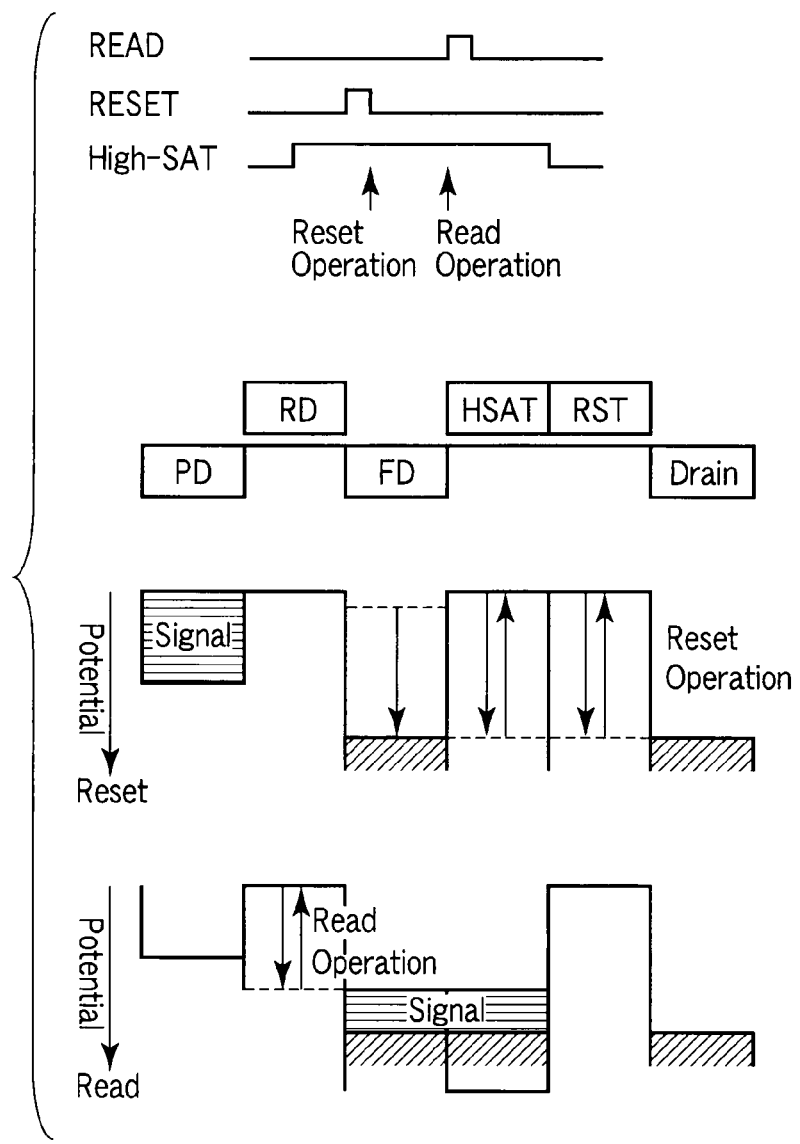
FIG. 5 is an exemplary view depicting an another example of operation timing in a case where the signal electric charge amount accumulated in the photodiode is relatively large in the unit pixel in FIG. 3, an electric potential on a semiconductor substrate in a reset operation, and electric potential in reading operation.

Meanwhile, FIG. 5 shows an example of operation timing, an electric potential in the semiconductor substrate in a reset operation and an electric potential in a reading operation, and a reset operation in a case where the signal electric charge amount accumulated in the photodiode PD in the unit pixel $1(m, n)$ is relatively large. That is, by simultaneously turning on the reset transistor RST and the transistor HSAT, the reset operation is performed. The electric potential of the floating diffusion FD immediately after the reset operation is set to the same electric potential level as that of the drain. After the termination of the reset operation, differing in a case where the forgoing signal electric charge amount is relatively small, while the reset transistor RST turns off, the transistor HSAT is maintained an on-state.

When the reading transistor RD is turned on at the next time, the signal electric charges can be accumulated in both the capacitance CFD of the floating diffusion FD and the gate capacitance CHSAT by means of the transistor HSAT. Therefore, even if the signal electric charge amount accumulated in the photodiode PD till the time is relatively large, it is possible to transfer all the signal electric charges to the floating diffusion FD and the gate capacitance CHSAT. As a result, it is possible to perform the reading operation without leaving the signal electric charges in the floating diffusion FD.

If the signal electric charge amount is relatively large, in general, since another noise, for example, a shot noise, or sensitivity unevenness becomes a main factor of a noise, getting hard to reduction the dark state random noise because of an increase in amount of the floating diffusion FD does not cause a practical problem.

Figure 6:
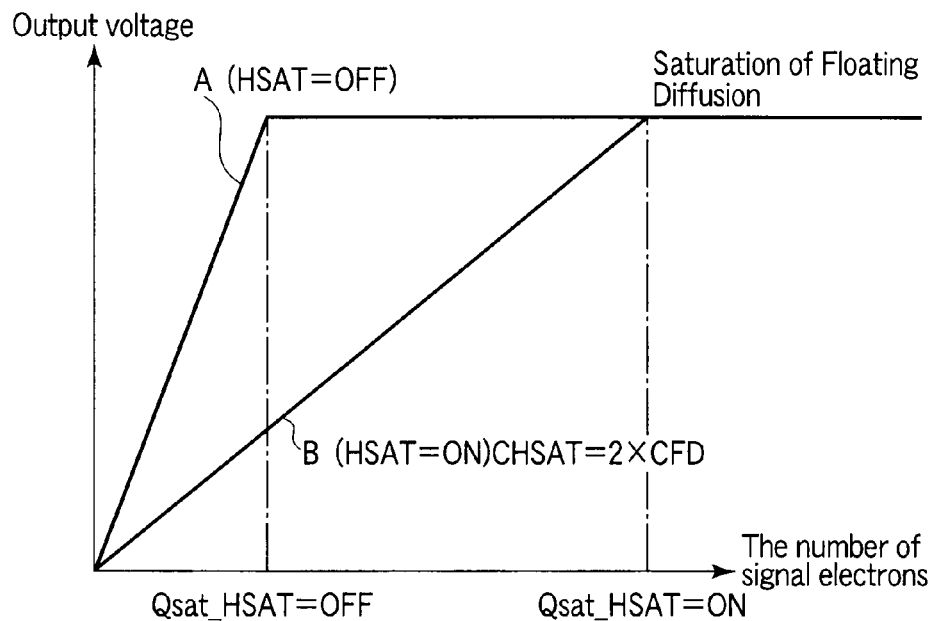
FIG. 6 is an exemplary view depicting an example of input/output characteristics of the CMOS image sensor of FIG. 3.

FIG. 6 shows a view illustrating an example of the input/output characteristics of the CMOS image sensor in FIG. 3. In FIG. 6, characteristics A shows a change in output voltage for signal reading when the transistor HSAT in the unit pixel is turned off (HSAT=OFF). In the characteristics A, with an increase in the number of signal electrons (electric charge amount) of the floating diffusion FD up to the number of saturated signal electrons (electric charge amount) Qsat_HSAT=OFF in an off state of the transistor HSAT, the output voltage drastically raises up to the saturation value.

Characteristics B shows a change in output voltage for signal reading when the transistor HSAT in the unit pixel is turned on (HSAT=ON). Here, a case where the gate capacitance CHSAT of the transistor HSAT is set to the double of the capacitance CFD of the floating diffusion FD is assumed. In the characteristics B, as the number of signal electrons of the floating diffusion FD increase up to the number of saturated signal electrons Qsat_HSAT=ON when the transistor HSAT is turned on, an output voltage gradually rises up to the saturation value.

As is cleared by FIG. 6, when the transistor HSAT is turned on, it is possible for the number of saturated signal electrons Qsat_HSAT=ON of the floating diffusion FD to substantially triple ("Qsat_HSAT=ON"="Qsat_HSAT=OFF"×3) the number of saturated signal electrons Qsat_HSAT=OFF of the floating diffusion FD, and it is possible to triple the signal electric charge treatment amount.

As mentioned above, in the CMOS sensor of the embodiment, the unit pixel includes: a photodiode PD configured to photoelectrically convert incident light and to accumulate the converted light; a reading transistor RD configured to read the signal electric charges from the photodiode PD; a floating diffusion FD configured to accumulate signal electric charges read from the reading transistor RD, a reset transistor RST configured to reset the electric potential of the floating diffusion FD; and a transistor HSAT for adding the capacitance between the floating diffusion FD and the reset transistor RST. When the electric charge amount of the floating diffusion FD is relatively small, the CMOS sensor turns off the transistor HSAT to raise the conversion gain without increasing the capacitance of the floating diffusion FD. Conversely, when the signal electric charge amount of the floating diffusion FD is relatively large, the CMOS sensor turns on the transistor HSAT to increase the capacitance of the floating diffusion FD, and secures the signal electric charge treatment amount. In this way, by using two operation modes, increasing the signal electric charge treatment amount is enabled while maintaining a low noise level.

While the operation examples shown in FIGS. 4 and 5 controls on/off of the reset transistor RST in reset operation in the same way as that of the transistor HSAT, the reset transistor RST may be always turned on and the transistor HSAT only may control on/off.

Second Embodiment

Figure 7:
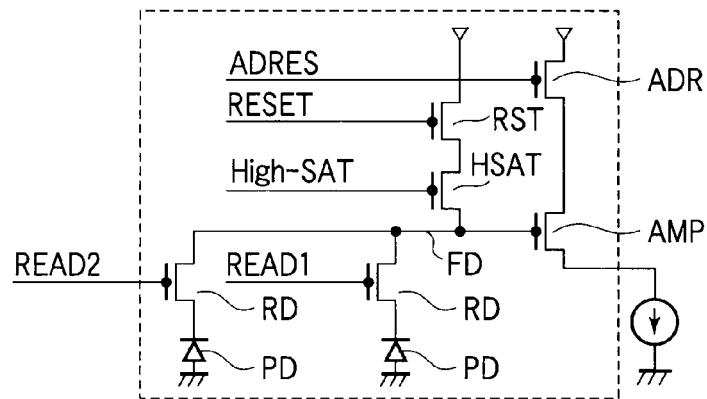
FIG. 7 is an exemplary circuit view extracting and depicting a unit pixel in a CMOS image sensor according to a second embodiment of the present invention.

FIG. 7 shows a circuit view taking out to illustrate the unit pixel in the CMOS image sensor according to a second embodiment of the present invention. The unit pixel has different points, in comparison to the unit pixel 1(m, n) of the aforementioned first embodiment, that in the unit pixel, a plurality of pairs (two pairs, in this example) of a serial circuit of the photodiode PD and a reading transistor RD are disposed, one end of each reading transistor RD is commonly connected to the floating diffusion FD, two reading transistors RDs are controlled to read by separated control signals READ1, READ2. That is, transistors AMP, RST, HSAT and ADR consisting of an output circuit are shared by two photo diodes PDs and two reading transistors RDs. The plurality of pairs (two pairs, in this example) of the photodiodes PDs may be different in optical sensitivity from each other.

The CMOS image sensor in the second embodiment, includes one transistor HSAT having one additional circuit element for two photodiode PDs and two reading transistor RDs in the unit pixel, and having the number of the additional circuit elements per one photodiode PD is only 0.5, and the number of the additional circuit elements is smaller than that of the first embodiment.

Operations of the unit pixel in the second embodiment is almost the same as those of the unit pixel in the first embodiment, it is possible to over the tradeoff relationship between the dark state random noise and the unit pixel to increase the signal electric charge treatment amount while maintaining the low noise in the dark state.

Third Embodiment

Figure 8:
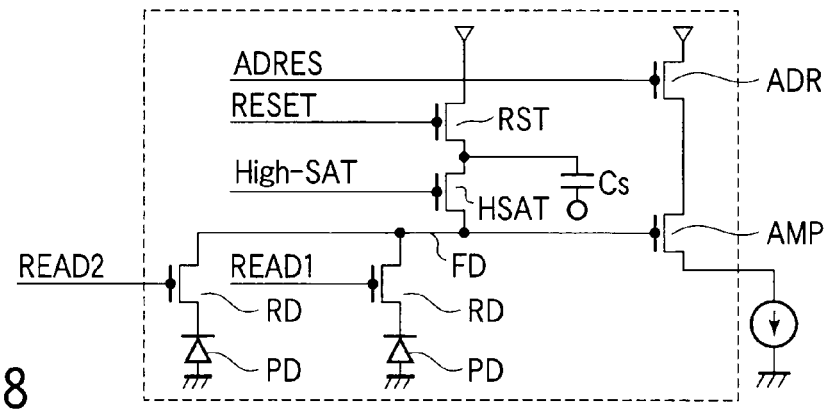
FIG. 8 is an exemplary circuit view extracting and depicting a unit pixel in a CMOS image sensor according to a third embodiment of the present invention.

FIG. 8 shows a circuit view taking out to illustrate the unit pixel in the CMOS image sensor according to a third embodiment of the present invention. This unit pixel differs from the unit pixel 1(m, n) of the second embodiment in a point that a capacitor Cs is connected between a mutual connection node of the transistors RST, HSAT and a predetermined electric potential node (e g., ground potential node).

The COMS image sensor of the third embodiment, in the unit pixel, the number of additional circuit elements for two photodiode PDs and to two reading transistor RDs is one transistor HSAT and one additional capacitor Cs, the number of additional circuit elements per one photodiode PD is only one.

The operations of the unit pixel in the third embodiment are almost the same as those of the unit pixel of the second embodiment, get over the tradeoff relationship of the dark state random noise and the signal electric charge treatment amount, and enable increasing the signal electric charge amount while maintaining the low noise in the dark state, and also get a dynamic range wide by adding the capacitor Cs. That is, the signal electric charge amount is proportional to substantial capacitance of the floating diffusion FD, and if the capacitor Cs exists, the substantial capacitance of the floating diffusion FD in a case of turning on of the transistor HSAT is expressed by a formula of CFD+CHSAT+Cs, the signal electric charge treatment amount is easily increased.

In each embodiment, in a case where an incident light amount is large, the signal electric charge which cannot be accumulated in the photodiode PD overflows to the floating diffusion FD through the under of the gate of the reading transistor RD. Therefore, it is preferable for a threshold voltage of the transistor HSAT to be set lower than a threshold voltage of the reading transistor RD. The signal electric charges which are overflowing to the floating diffusion FD may be discharged into a drain through the under of the gate of the transistor HSAT.

In each embodiment, the threshold voltage of the transistor HSAT is better to be equal to 0 V or lower. Then, the CMOS image sensor can operate without applying a high voltage to the gate of the transistor HSAT.

It is preferable for the gate capacitance CHST of the transistor HSAT to be set larger than the capacitance CFD of the floating diffusion FD. Because, when the High-SAT mode is turned on, the capacitance of the floating diffusion FD is expressed by a formula of CFD+CHSAT, and when the High-SAT mode is turned off, the capacitance thereof is expressed by CFD, so that if the CHSAT is smaller than the CFD, a capacitance expansion effect of the floating diffusion FD becomes small. In a case where a relationship of CHSAT=CFD is established, the CMOS image sensor doubles the capacitance expansion effect of the floating diffusion FD. Accordingly, if the relationship of CHSAT>CFD is established, the CMOS image sensor can doubles or more the capacitance expansion effect of the floating diffusion FD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device, comprising:
a pixel area comprising
    a photodiode configured to photoelectrically convert incident light;
    a first transistor configured to connect the photodiode and to read signal electric charges from the photodiode;
    a floating diffusion configured to connect the first transistor and to accumulate the signal electric charges read from the first transistor;
    a second transistor configured to connect the floating diffusion and to selectively add capacitance to the floating diffusion; and
    a third transistor configured to connect the second transistor and to reset an electric potential of the floating diffusion; and
a correlated double sampling and analog to digital conversion circuit configured to convert a pixel signal output from the pixel area into a digital signal, wherein
    a threshold voltage of the second transistor is 0V or lower,
    the second transistor is made conductive on the basis of an output signal from the correlated double sampling and analog to digital conversion circuit and adds capacitance to the floating diffusion, and the second transistor is made nonconductive on the basis of the output signal,
    when the second transistor adds the capacitance to the floating diffusion, the added capacitance is of a value larger than a capacitance of the floating diffusion,
    when a signal electric charge amount read from the first transistor is equal to or larger than a saturation level of the floating diffusion, the second transistor is made conductive on the basis of the output signal and the second transistor adds the capacitance to the floating diffusion, and
    when the signal electric charge amount read from the first transistor is not larger than the saturation level of the floating diffusion, the second transistor is made nonconductive on the basis of the output signal.

2. The device according to claim 1, wherein the second transistor has a threshold voltage lower than that of the first transistor.

3. The device according to claim 1, further comprising in the pixel area:
a fourth transistor configured to connect the floating diffusion and to amplify a signal of the floating diffusion; and
a fifth transistor configured to connect the fourth transistor and to be conductively controlled on the basis of an address signal.

4. The device according to claim 1, further comprising:
a fourth transistor having a gate and a conductive path, connected to the floating diffusion through the gate and amplifying a signal of the floating diffusion to output to a vertical signal line through one of the conductive path;
the correlated double sampling and analog to digital conversion circuit connected to the vertical signal line and configured to convert a pixel signal received from the vertical signal line into a digital signal;
a signal level determination circuit configured to receive the digital signal converted by the correlated double sampling and analog to digital conversion circuit and to determine a level of the pixel signal output from the pixel area; and
a control signal generation circuit configured to receive a determination output from the signal level determination circuit and to output a control signal for controlling the second transistor on the basis of the determination output.

5. A solid-state imaging device, comprising:
a plurality of photodiodes each configured to photoelectrically convert incident light;
a plurality of first transistors configured to connect the plurality of photodiodes and to respectively read signal electric charges from the plurality of photodiodes;
a floating diffusion configured to commonly connect the plurality of first transistors and to accumulate the signal electric charges read from the plurality of first transistors;
a second transistor configured to connect the floating diffusion and to selectively add capacitance to the floating diffusion;
a third transistor configured to connect the second transistor and to reset an electric potential of the floating diffusion; and
a correlated double sampling and analog to digital conversion circuit configured to convert a pixel signal output from the pixel area into a digital signal, wherein
    a threshold voltage of the second transistor is 0V or lower,
    the second transistor is made conductive on the basis of an output signal from the correlated double sampling and analog to digital conversion circuit and adds capacitance to the floating diffusion, and the second transistor is made nonconductive on the basis of the output signal,
    when the second transistor adds the capacitance to the floating diffusion, the added capacitance is of a value larger than a capacitance of the floating diffusion,
    when a signal electric charge amount read from the first transistor is equal to or larger than a saturation level of the floating diffusion, the second transistor is made conductive on the basis of a control signal and the second transistor adds capacitance to the floating diffusion, and
    when the signal electric charge amount read from the first transistor is not larger than the saturation level of the floating diffusion, the second transistor is made nonconductive on the basis of the control signal.

6. The device according to claim 5, wherein the plurality of photodiodes are composed of a first and a second photodiodes, and the plurality of first transistors are composed of two transistors corresponding to the first and the second photodiodes.

7. The device according to claim 6, wherein the first and the second photodiodes are photodiodes differing in optical sensitivity from each other.

8. The device according to claim 5, wherein the second transistor is configured to be conductively controlled on the basis of a control signal, and to add capacitance to the floating diffusion.

9. The device according to claim 5, wherein the second transistor has a threshold voltage lower than each threshold voltage of the plurality of first transistors.

10. The device according to claim 5, further comprising:
a fourth transistor configured to connect the floating diffusion and to amplify a signal of the floating diffusion; and
a fifth transistor configured to connect the fourth transistor and to be conductively controlled on the basis of an address signal.

11. The device according to claim 5, further comprising:
a fourth transistor having a gate and a conductive path, connected to the floating diffusion through the gate and amplifying a signal of the floating diffusion to output to a vertical signal line through one of the conductive path;

a correlated double sampling and analog to digital conversion circuit connected to the vertical signal line and configured to convert a pixel signal received from the vertical signal line into a digital signal;

a signal level determination circuit configured to receive the digital signal converted by the correlated double sampling and analog to digital conversion circuit and to determine a level of the pixel signal output from the pixel area; and a control signal generation circuit configured to receive a determination output from the signal level determination circuit and to output a control signal for controlling the second transistor on the basis of the determination output.

12. A solid-state imaging device, comprising:

a pixel area configured to include a plurality of pixels and to output a signal of each pixel, each pixel includes
   a photodiode configured to photoelectrically convert incident light;
   a first transistor configured to connect to the photodiode and to read signal electric charges from the photodiode;
   a floating diffusion configured to connect the first transistor and to accumulate the signal electric charges read from the first transistor;
   a second transistor configured to connect the floating diffusion and to selectively add capacitance to the floating diffusion; and
   a third transistor configured to connect the second transistor and to reset an electric potential of the floating diffusion, wherein
      a threshold voltage of the second transistor is 0V or lower, and
      when the second transistor adds capacitance to the floating diffusion,
      the added capacitance is of a value larger than a capacitance of the floating diffusion;

a correlated double sampling and analog to digital conversion circuit configured to convert a pixel signal output from the pixel area into a digital signal;

a signal level determination circuit configured to receive the digital signal converted by the analog to digital conversion circuit and to determine a level of the pixel signal output from the pixel area; and a control signal generation circuit configured to receive a determination output from the signal level determination circuit and to output a control signal for controlling the second transistor on the basis of the determination output, wherein
   the second transistor is made conductive on the basis of an output signal from the correlated double sampling and analog to digital conversion circuit and adds the capacitance to the floating diffusion, and the second transistor is made nonconductive on the basis of the output signal,
   when a signal electric charge amount read from the first transistor is equal to or larger than a saturation level of the floating diffusion, the second transistor is made conductive on the basis of the output signal and the second transistor adds the capacitance to the floating diffusion, and
   when the signal electric charge amount read from the first transistor is not larger than the saturation level of the floating diffusion, the second transistor is made nonconductive on the basis of the output signal.

13. The device according to claim 12, wherein the second transistor is made conductive when the control signal is in a first state, adds capacitance to the floating diffusion, and is made nonconductive when the control signal is in a second state.

14. The device according to claim 12, wherein the second transistor has a threshold voltage lower than that of each of the plurality of first transistors.

15. The device according to claim 12, wherein the plurality of each of pixels, further comprising:
   a fourth transistor configured to connect the floating diffusion and to amplify a signal of the floating diffusion; and
   a fifth transistor configured to connect the fourth transistor and to be conductively controlled on the basis of an address signal.

* * * * *